United States Patent [19]
Kime

[11] Patent Number: 6,007,888
[45] Date of Patent: Dec. 28, 1999

[54] DIRECTED ENERGY ASSISTED IN VACUO MICRO EMBOSSING

[76] Inventor: Milford B. Kime, 221 Mt. Auburn St., Cambridge, Mass. 02138

[21] Appl. No.: 09/075,155

[22] Filed: May 8, 1998

[51] Int. Cl.⁶ ........................................................ B32B 3/00
[52] U.S. Cl. ........................ 428/64.1; 428/64.2; 428/64.4; 428/913; 264/1.1; 264/1.33; 264/101; 430/270.1; 430/945
[58] Field of Search .................................... 264/1.1, 1.31, 264/1.33, 101, 107, 220; 428/64.1, 64.2, 64.4, 411.1, 913; 430/270.1, 495.1, 945; 369/275.1, 283, 288

[56] References Cited

U.S. PATENT DOCUMENTS 5,078,947   1/1992   Nishizawa et al. ...................... 264/1.1

*Primary Examiner*—Elizabeth Evans
*Attorney, Agent, or Firm*—Perkins, Smith & Cohen, LLP; Edwin H. Paul; Jerry Cohen

[57] ABSTRACT

Various configurations of a directed energy assisted micro embossing machine/station in a vacuum chamber utilized in a continuous manufacturing process and the web structure products made by that process (optical disks, cards, tapes, holographic reflectors, diffusers, binary optical elements, etc.) are disclosed. The configurations can include a single machine roll to roll system for embossing optical features on the surface of a single substrate and applying appropriate metallic, dielectric, semiconductor, polymer and other coatings all in a vacuum chamber.

22 Claims, 2 Drawing Sheets

DIRECTED ENERGY ASSISTED IN VACUO MICRO EMBOSSING

FIELD OF THE INVENTION

This invention relates generally to optical storage products (and other optical devices such as holographic and binary diffractive elements). More particularly this invention relates to optical storage products where diffractive or refractive features on the order of a few microns or less are embossed on the surface of a substrate and coatings may be applied to these devices by vacuum evaporation, sputter, vapor deposition or other vacuum coating techniques.

BACKGROUND OF THE INVENTION

The widespread adoption of optical storage products such as the "Compact Disc" (CD) has made it desirable to manufacture these products by processes which have the potential to greatly increase throughput and decrease cost. Optical storage products made by such a process could greatly increase the dissemination of information while reducing the need for paper production with its negative environmental impact and improving the accessibility and archivability of the information.

Continuous processes most notably roll to roll are known to be more effective in making large volumes of products at low cost. The well known "floppy" magnetic disks are one good example of this. In fact rolls of the disk material structures are commonly sold as product in the "floppy industry." However optical disks and other elements are almost exclusively made by discrete batch injection molding based processes. As a consequence of this history several attempts have been made to manufacture optical media in continuous processes. The article "Continuous manufacturing of thin cover sheet optical media" by Slafer et. al. (including the present inventor) in the Proceedings of the SPIE (Vol. 1663 pg. 324) describes one approach. U.S. Pat. No. 4,831,244 ('244) discloses optical card structures with disk patterns made using the approach of this publication. The book, "Optical Recording—a Technical Overview, by Alan B. Marchant, published by Addison-Wesley Publishing Co. 1990 presents a good view of prior art techniques, especially the section on Mastering, page 327. The article in the Proceedings of the SPIE and the book are both hereby incorporated by reference herein as if laid out in full text. In the SPIE article a continuous roll embossing process is used to create optical features on the surface of a substrate which is then coated with appropriate absorptive, active, reflective and or refractive layers to produce functional optical media or elements. Land in U.S. Pat. No. 4,366,235 ('235) describes the general outline of the process of embossing a roll of substrate with appropriate optical features using an embossing drum and fluid. These process steps are characterized as "known in the art". A similar approach is described by Beaujean in U.S. Pat. No. 4,543,225 (225). Another similar approach by Foster U.S. Pat. No. 4,836,874 ('874) uses roll embossing with a fluid that has a dye included for improving the feature forming by absorbing laser light. All of these approaches are characterized by one or more of the following elements: lamination of a thin web to a cover sheet, embossing by a fluid, manufacture of a special embossing drum, and separate processing steps.

The past attempts to manufacture optical media and components in a continuous process have shared the characteristic that they have not been truly continuous but rather have been segmented and in many cases multiple substrate processes. In the case of the above cited U.S. Pat. Nos. '244, '225, and '874, two substrate webs are used and a chemical fluid based embossing process is employed. This requires that the vacuum coating of recording and or reflective layers be done in a separate segmented step.

Another problem associated with a chemical embossing process is the drum used to effect the embossing. If the drum does not have a seamless surface, fluids can accumulate in and flow out of the seams onto the substrate thus destroying the fine structure tolerance features which are necessary for optical grade devices and media. Seamless drums are difficult to fabricate, time consuming, and consequently expensive especially in wide web systems. One would like to use discrete embossing tools individually mounted on a drum as they are easy to manufacture using existing optical mastering and electroforming technology, they allow mounting across web as a means to work with wide webs, and as is disclosed later they can be compensated for distortions resulting from wrapping them on a drums' surface. Also discrete embossing tools can be easily changed for short run, quick turn around situations. An additional problem with earlier processes is the need for an high cleanliness environment laminating step in order to provide a low defect bond line between the thin web which is vacuum coated and the thick web optical cover sheet that provides isolation from surface defects and makes the structure sufficiently rigid and flat.

In an attempt to avoid the consequences of the earlier fluid based embossing U.S. Pat. Nos. 5,423,671, 5,368,789, 5,281,371, 5147,592, and 5,075,060 combine embossing into the process of extruding or molding of a thick substrate. Unfortunately this approach has similar problems to the earlier efforts when it comes to the need for a seamless embossing tool, as now the tool is part of the extrusion process. To achieve proper gauge thickness and tolerance along with avoiding "flashing" into the seams of a drum with discrete tools mounted on its surface is very difficult. As the gauge thickness appropriate to higher numerical aperture optics systems decreases, these problems will magnify. This will compromise the speed of the extrusion process, the bulk material birefringence, and its cost. Most important this approach makes it very difficult to integrate the embossing step into a single continuous vacuum machine as extrusion is combined with embossing. A consequence of this unintegrated process architecture is that the most critical surface in the structure the embossing is vulnerable to damage via handling before the vacuum coatings and protective layers can be added to complete the manufactured structure.

Generally speaking it is essential to avoid the use of fluids or liquids in embossing and to separate the extrusion of the substrate from the embossing step. This eliminates as much as possible the potential for outgassing and other vacuum compromising effects and allows extrusions to be made off line at maximal widths and web speeds. Also it is mandatory that only micron dimensional volumes of material be activated and or enabled to participate in the embossing step thus eliminating the potential for structural compromise like dimensional changes, stress, birefringence, and other distortion producing effects and material movement into interstitial boundaries between discrete embossing tools. These principles are the basis for developing a machine architecture which combines all process steps into one machine, uses a single substrate, and employs individual embossing tools so quick turnaround with high volume is realizable. It is important to emphasize that the novel object of this invention is to create a process architecture compatible with the environment in a vacuum coating chamber not that a vacuum be used to make the embossing. Bussey et. al. in U.S. Pat. No. 3,957,414 disclose the use of a vacuum between a substrate and an embossing "screen", but it is evident that this approach would not work in a vacuum chamber where there would be no gas to apply pressure to the substrate.

Another problem inherent with drum embossing is the distortion due to the curved contour of a drum. While is easy to master rectilinear features directly on a drum tool as would be the case for tape or card stripes, the use of a standard disk mastering recorder is essential to making precision circular tracks as found on disks. This however requires the tools (stampers) to be wrapped around a drum circumference and results in the distortion of the circular track patterns. When a planar tool of finite thickness is wrapped on a drum, patterns on the outside surface are elongated and patterns on the inside are shortened in the circumferential direction. Thus circles become prolate ellipse like patterns on the outside of tools wrapped on a drum. In the case where a substrate is wrapped around the tool and then returned to a flat geometry, the same effect occurs but patterns on the inside are elongated and so the problem is compounded. One solution to this problem is to precompensate for this effect using the mastering machine to record oblate rather than circular track patterns, but this approach has problems and limitations if the substrate is thick (0.1 mm or greater) as will be the case for single substrate disk or card manufacturing processes as contemplated in the preferred continuous single machine.

It is an object of the present invention to provide a method and a single integrated apparatus, which in a single pass continuously embosses and coats a continuous substrate.

It is another object of the present invention to provide a system without using any liquids, or molten/fluid state materials.

It is yet another object of the present invention to provide a conditioning of a substrate immediately prior to embossing, wherein the conditioning prepares the substrate and stamper for impressing the embossing pattern.

Yet another object of the present invention is to provide an embossing process that is compatible with the coating environment, such that the embossing and coating can be accomplished in the same environment.

Another object of the present invention is to provide uninterrupted process starting with a roll of substrate and ending with a roll of finished embossed and coated structures ready for cutting from the web.

Still another object of the present invention is provide a process and apparatus that is compatible with discrete embossing tools as this gives greater flexibility, quicker turnaround with higher volumes and lower cost to the process.

It is still another object of the present invention to provide a single environment wherein the entire embossing and coating is accomplished.

It is still another object of the present invention to compensate for embossing distortion found when embossing using stamper tools with a finite thickness are mounted on drums. A related object is to provide such compensation for distortion effects on a single thick substrate.

SUMMARY OF THE INVENTION

The above objects are met with a single machine continuous system where the embossing step is integrated with the requisite environmental (vacuum in a preferred embodiment) chamber coating steps in a single pass process. This results in a continuous uninterrupted process and system wherein a roll or sheet of substrate is embossed and coated.

Due to the large base of materials science and production capability in this field, in a preferred embodiment, it is advantageous to work with the existing molding materials as much as is practical. Three of the more common methods and materials of molding are: 1) thermoforming of polymers (e.g. polycarbonate), 2) cross linking of resists (photochemical materials), and 3) curing of thermosetting resins. However, as mentioned above these molding methods normally utilize polymers in fluid or molten states to form optical disk or element substrates that are incompatible with use in a vacuum.

The present invention uses no liquids, and in a preferred embodiment advantageously uses directed energy beams to assist in the creation of "micro molds" by conditioning the surface of a substrate just prior to embossing in a continuous manner. Directed energy beams of electrons, ions, nuclear particles, photons, etc. have a unique ability to concentrate depth dose profiles of ionizing or direct thermal excitation radiation in shallow profile surface volumes of materials. These beams can and often must be generated and propagated in vacuum environments, which is the environment used for coating (vacuum evaporation or sputtering and the like) the embossed substrates. The use of electrostatic, electromagnetic, refractive, reflective, and other techniques for shaping beams and/or scanning them are well known and powerful tools for directing energy deposition in timely and efficient ways. The embossing assist technique herewith disclosed is the use of directed energy beams concentrated in or near a nip created between a substrate and an embossing tool by virtue of a pressure roll and a mounting drum. This assist to conventional thermal and pressure embossing creates an effective mold in said nip region whose volume and temporal duration are sufficiently constrained so that an impression on the surface of the embossing tool can be transferred to the substrate surface and retained with requisite fidelity and speed to make optical media and similar elements in high volumes with low labor, overhead, and other costs. The substrates can be solid embossable plastics such as extruded polycarbonate or carrier mechanical webs (e.g. polyester) coated with appropriate embossable layers.

The above described distortion problem and limitation of the prior art processing using a drum for embossing is relieved in the present inventive approach which uses the deformation process itself (or in conjunction with mastering) to compensate for the distortion. With reference to FIG. 2, the second generation tool ("mother"—M) which is used to make the final tool(s) (stamper) is made with a conventional electroforming cell. It is mounted on an electrode E1 in an electroforming cell with a significantly smaller radius R1 than the radius of curvature R2 of the embossing drum. The stamper plated in the curved cell will be formed with a somewhat oblate pattern on the outside of a curved surface by virtue of the curvature of the mother and/or some precompensation. When the stamper is somewhat flattened onto the more modest radius of curvature R2 of the embossing drum, it will deform to produce a more oblate pattern. This pattern when transferred to a substrate which is subsequently flattened will result in a circular track pattern. This approach requires the embossing process to be compatible with individual tools obtained by this compensation method.

In a preferred embodiment of the present invention, a single machine provides continuous manufacture on a web (roll, sheet, as defined herein) substrate of optical media and/or optical component elements. The economic impact of this is to make the manufacturing costs distinctly lower especially for complex structures (e.g. phase change and other multi layer vacuum coated recordable media). This is because the cycle time per unit can be significantly shorter i.e. fractions of a second rather than seconds, and the use of a single machine reduces the handling and set up time of using several machines and processes. Moreover, the reduced handling decreases the breakage and the rejection rates. This means that depreciation, labor and other costs are absorbed over many more units. Also of even greater economic impact is the potential for quick turnaround very high volume production from a single machine making possible the distribution of time sensitive matter like that found in magazines and newspapers. An additional advantage of the present invention is the ability to produce optical media and elements simultaneously in the same web (e.g. ROM and holographic optical elements), thus the value of such a structure output from the inventive process is significantly enhanced.

Other objects, features and advantages will be apparent from the following detailed description of preferred embodiments thereof taken in conjunction with the accompanying drawings in which:

DETAILED DESCRIPTION OF PREFERRED EMBODIMENTS

Figure 1:
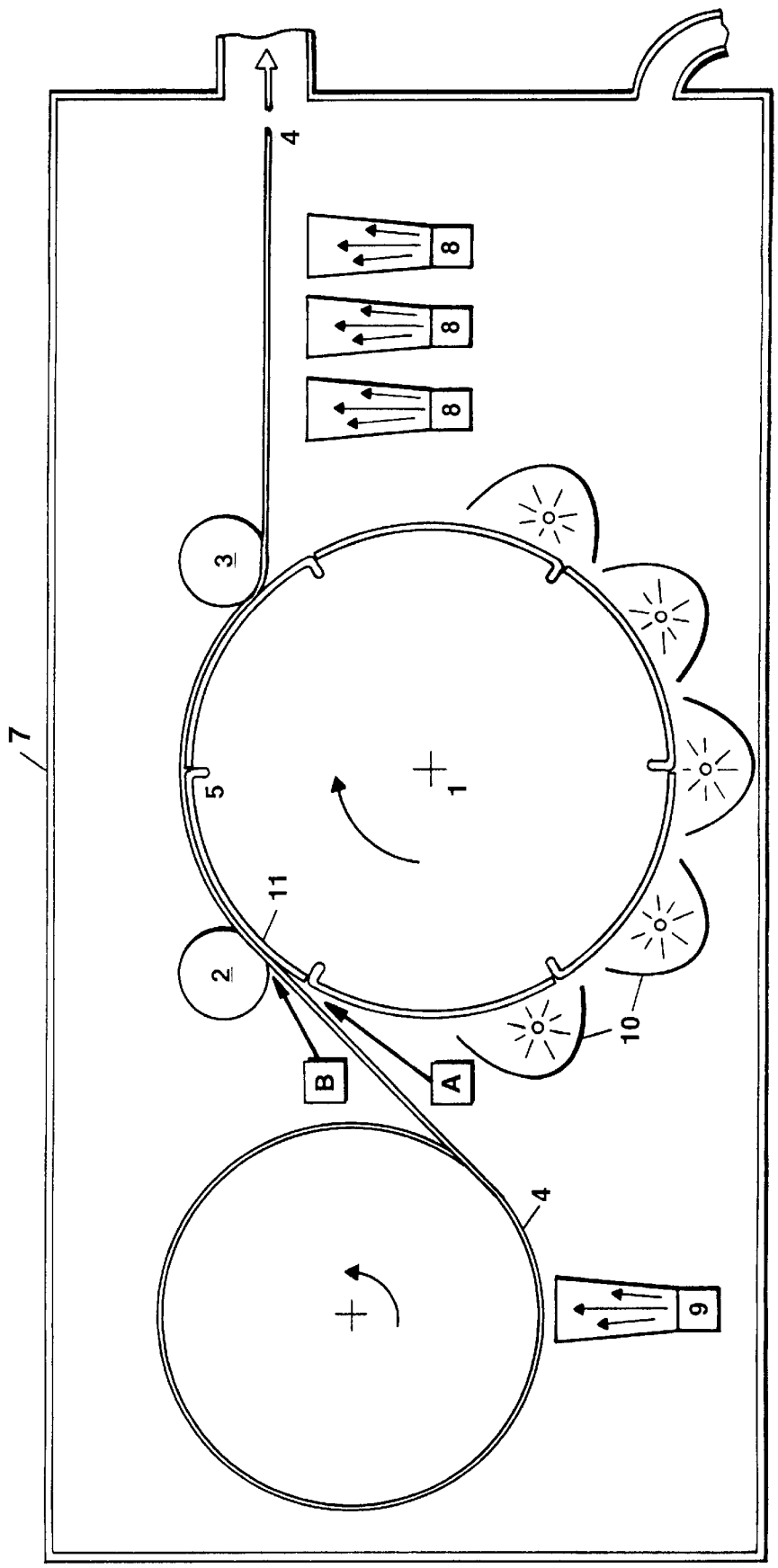
FIG. 1 is a cross sectional diagram of an embossing machine/station showing the principal elements combined in a vacuum chamber with vacuum coating stations and indicating a connecting pathway to contiguous chambers which may contain other coating stations as well as roll take up or sheeting components of the disclosed continuous single machine architecture.

FIG. 1. shows a diagram of one possible configuration of the embossing machine/station. A drum 1 and pressure roll(s) 2, 3 confine a web (roll or sheet) substrate material 4 to produce a nip 11 with an embossing tool which is clamped or bonded to the drum at its leading edge 5 as is the case for multiple other individual tools 6. Herein "web" is defined as the bulk forms of substrates as delivered form manufacturers, including but not limited to sheets, rolls, tapes, and the like. Directed energy is concentrated into the nip area from source position A for beam quanta which are directly absorbed by the substrate or alternatively from source position B for those quanta which can penetrate the substrate and deposit energy at the opposite surface either by virtue of the quanta energy chosen and/or surface treatment of the substrate. The energy is directed into the substrate and the embossing tool surfaces in proportions which are dictated by the nature of the polymer molding mechanism which is employed (i.e. thermoforming, cross linking, or thermosetting). The entire machine is contained in a vacuum pumped chamber 7 which can hold a vacuum similar to that used for typical vacuum coating purposes as diagrammed by the coating heads 8. Enhancement of the surface of the substrate, prior to embossing, can be accomplished by vacuum metalization, ion implanting, dye/polymer coatings, and/or other treatments can be done for example by the coater head(s) 9. Also, the surface of the stamper tools can be cleaned, preheated, coated or otherwise conditioned by directing energy from plasma ion infrared photon, and other sources at locations 10. This chamber can be a single large vessel containing all process steps or a compartmentalized structure if isolation of the process steps produces better conditions due to differential pumping, baffling or similar krnown vacuum system designs. It should be noted that pressure roll 3 is optional and not necessary if wrapping the substrate on the drum can be avoided as is desirable since this produces less pattern distortion.

In a preferred embodiment the polymer molding mechanism is thermoforming and the directed energy is infrared photons or electrons, both of which can produce depth dose profiles of a few microns. They can be supplied from high current filament sources or lasers. Examples include a linear resistive filament with a parabolic reflector, an electron gun similar to that used in a cathode ray tube or X-ray tube, a $CO_2$ laser, etc. The beam can be directed into the nip vicinity by a variety of known techniques such as reflector collimators, electrostatic optics, cylindrical refractive elements, and a variety of other known art elements. Scanning by electric fields in the case of electrons or for photons: acousto-optic deflectors, polygons, or galvanometers can also be used so long as the scan rate is sufficient to assure continuous uniform depth dosing of the active mold volume. A small Gaussian scanning spot has the advantage that it can be monitored, shaped and guided easily. From the standpoint of simplicity, a linear extended spot stretching across the nip is desirable and can be formed with simple optical techniques in the case of photons.

Various enhancements to this embodiment may be employed. For example the surface of the substrate may be textured during extrusion to improve absorption and reflection characteristics. In addition co-extrusion or coating of an absorption enhancing layer may be done in line with the substrate extrusion or in the embossing chamber at location 9 in FIG. 1 using vacuum techniques. Thin layers of ion implanted, metal evaporated, or polymer vapor vacuum coatings are particularly useful especially in conjunction with texturing. The surface of the embossing tools can also be coated or otherwise treated at location 10 to optimize the absorption to reflection ratio for the particular beam quanta chosen. In the case of media where the recording/reading is not done through the substrate (e.g. tape or near field disks) a reflector layer on the surface of a mechanical carrier web with a thin embossable coating on top will produce a high depth dose concentration in the coating layer.

Another embodiment of directed energy embossing using thermoforming is with the beam directed through the substrate as from position B in FIG. 1 (or alternatively the back side of the nip roller 2). In this case the beam quanta must be capable of penetrating the substrate and depositing energy at the surface adjacent to the embossing tool and/or the tool surface. It is well known that charged particles have ranges in materials characterized by a relationship to their energy and that a substantial portion of the energy is deposited at the end of range for the case of ions so they are a natural candidate for this approach. Also near infrared and visible photons can pass through substrates and interact with the surface of the embossing tools or with enhancing surface layers on the substrate as described above.

It is important to note that grazing incidence is of significant importance in coupling the directed energy into the surfaces of the substrate and tool and that the disclosed source positions are essential in providing said angle of incidence. Small angle incidence reduces the depth dose into the substrate by about the sine of the angle. If photons are used and the direction is through the substrate at the "critical" angle, total internal reflection will result and coupling to the surface will be very good. Also with the disclosed direction of beam energy it is possible to apportion the dose between the substrate surface and the tool. Small angle incidence will result in forward scattering off the tool and substrate thus propagating more energy deep into the nip. In addition the use of two sources one at each of the disclosed positions is readily achievable. For example a CO2 laser could be used in position A and a near IR resistive filament/parabolic reflector source can be positioned at B. A third source option would be resistive electrical heating of the stampers at this point. Also with IR/parabolic reflector or plasma ion sources mounted around the circumference 10 of FIG. 1 and directed at the tools on the drum, it is possible to controllably modulate the temperature of the tools so that they are near the Vicat or thermoplastic softening temperature on entrance to the nip where they can transfer energy via conductive and radiant processes. After passing the nip roller they can be rapidly cooled through appropriate choice of the insulators mounted between the drum and tool backside. This will aid the embossing process by reducing the required directed energy in the nip and limiting the temperature cycle shock the tools experience.

Generally, in preferred embodiments, the depth dose required is 0.9 microns or less and the quanta ranges of interest are on the order of microns so the grazing incidence angle of optimal effect is in the neighborhood of 10 to 20 degrees.

As previously stated another embodiment of the disclosed embossing technique works with thermosetting resins (e.g. epoxies) which are 100% solids materials with viscous or thixatropic flow character and can be coated on a substrate in vacuum by known processes like gravure and slot head coating. The above described techniques for effecting embossing in thermoforming plastics will also work with thermosetting resins.

Yet another embodiment employs the ionizing nature of certain directed energy beams such as charged particle and UV photons to crosslink or polymerize monomer and copolymer precursors. Yializis in U.S. Pat. No. 4,954,371, Shaw et. al. in U.S. Pat. No. 5,725,909 and others disclose methods for vacuum vapor depositing and coating these materials thus making it possible to integrate these into vacuum micro embossing at position 9 as described above. Froehlig in U.S. Pat. No. 4,294,782 teaches liquid molding of these materials but the disclosed process teaches the use of molds transparent to the radiation used rather than directing energy into a nip in a vacuum, so the approach is not consistent with using standard electroformed tools and an integrated single machine.

In the case of thermosetting or thermoforming the impression and fixing mechanisms rely on heating in different ways and thus require somewhat different geometry's and proportionality. Thermoforming requires that the surface of the substrate receive sufficient energy to soften the material so that it will accept the impression of the embossing tool, but fixing the features rapidly requires that the bulk of the substrate remain cool so that the embossing is rapidly frozen in place as heat diffuses into the bulk of the substrate. Directing energy into the tool can aid this process by conducting energy into the nip contact point and simultaneously making its distribution across the nip more uniform. The nip pressure must be sufficiently great and uniform and the tool should be insulated from the drum so thermal loss time can be made long enough to aid in forming but short enough to fix the features rapidly. Thermosetting requires no softening so the energy dose should be directed at the embossing tool. In fact it is important to avoid dosing the resin until it has met the embossing tool as otherwise it may harden without taking the impression from the tool. With thermosetting, the dwell time on the drum may need to be extended to assure adequate cure whereas with thermoforming it is desirable to keep this time to a minimum to increase throughput and reduce distortion. With crosslinking it is also desirable to keep the energy beam away from the active substrate surface until the embossing tool nip has been engaged. With charged particles like electrons there is an added enhancing element in the form of secondary electrons and X-rays which can be exploited to increase ionization if the beam strikes the tool at an appropriate grazing angle. The substrate's active coating must be shielded appropriately but a shield may also be a secondary radiation converter if the primary beam incidence is chosen properly.

Figure 2:
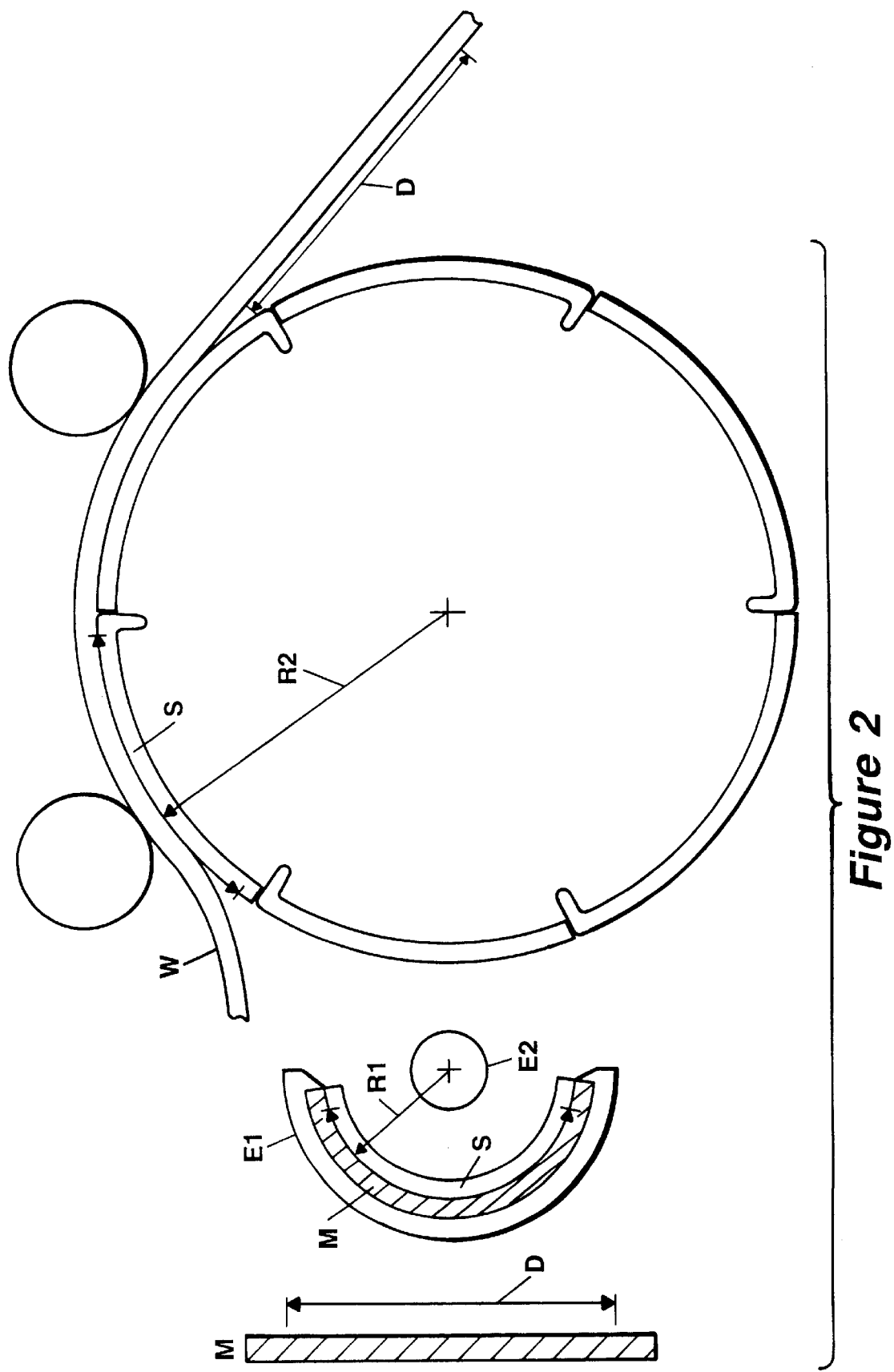
FIG. 2 is a diagram of the embossing tool distortion correction process. It shows electroforming of a stamper in a curved electroforming cell and then partial flattening on an embossing drum to produce a compensating correction to distortions in the surface relief patterns of the embossing tool and the embossed substrate.

A preferred embodiment for compensation of thick web distortions encountered in the continuous linear embossing drum method disclosed herein is to use the deformation process itself (or in conjunction with mastering) to compensate. This approach is illustrated in FIG. 2. The second generation tool ("mother"—M) which is used to make the final embossing tool ("stamper") is made in a standard planar electroforming cell. It is mounted on a curved electrode E1 in an electroforming cell which has a radius of curvature R1 significantly smaller than the embossing drum's radius R2. A disk pattern on the surface of the mother with a circular diameter D (indicated by the double headed arrow) is made using standard mastering techniques. When curved to conform to the electrode the double arrow dimension is distorted to a length D–d. The stamper plated in the curved cell will be formed with an oblate circular pattern on the outside of its curved surface by virtue of being plated against the curved mother in the curved geometry of the cell. When the stamper is somewhat flattened onto the more modest radius of curvature of the embossing drum, it will deform to produce an even more oblate pattern with a double headed arrow dimension D–d–c where the added distortion of wrapping on the drum is characterized by the dimension c. This pattern when transferred to a substrate web (W) which is subsequently flattened as shown (coming off the drum) will result in a track pattern diameter double headed arrow of length D–d–c+e. Where e is the prolate expansion that occurs when the thick substrate is returned to a flat geometry. If one wants the final diameter to end up at the value D as shown in the figure then one must arrange that D–d–c+e=D or d+c=e. This is done by calculating the value of R2/R1 and the thicknesses of m and s which will produce the sum of oblate distortions d+c which cancel the prolate distortion e.

In the case where a thin substrate is used and very little effect is encountered in flattening the web, it may actually be necessary for the electroforming cell to have a radius comparable to or larger than the embossing drum (i.e. c may need to have a negative value).

Obviously the above approach will only work with discrete embossing tools that can be manufactured and compensated in this manner, thus requiring the embossing process to be compatible with individual tools obtained by this compensation method.

It will now be apparent to those skilled in the art that other embodiments, improvements, details and uses can be made consistent with the letter and spirit of the foregoing disclosure and within the scope of this patent, which is limited only by the following claims, construed in accordance with the patent law, including the doctrine of equivalents.

What is claimed is:

1. Optical media and optical element web structures comprising a micro embossing refractive or diffractive relief surface on a single substrate surface coated with optical functioning metal, semiconductor, dielectric, dye, polymer and other materials plus a mechanical protective layer, wherein said micro embossing and surface coating(s) are performed entirely in vacuum.

2. The optical media and optical element web structures as defined in claim 1 wherein said optical media and optical elements comprise optical memory disks, cards, tapes and holographic or binary diffractive elements on the same roll or sheet.

3. A continuous process for manufacturing optical storage media and/or optical elements from a continuous film substrate comprising the steps of:

evacuating the local environment, within said local environment, embossing of the substrate, and within said local environment, coating the embossed substrate.

4. The continuous process as defined in claim 3 wherein the step of embossing comprises the steps of: forming read only memory media and forming holographic elements.

5. The continuous process as defined in claim 3 wherein the step of embossing comprises the steps of:

intimately contacting the substrate along a first portion of an embossing tool, continuing the contacting of the substrate and the tool in a cross web linear fashion until the entire tool has impressed the substrate, and conditioning that part of the substrate immediately prior to or at the contact point.

6. The process as defined in claim 5 wherein said conditioning comprises the step of a shallow depth dosing of the substrate by directing energy into the surface.

7. The process as defined in claim 6 wherein the step of directing energy includes directing a beam selected from the group consisting of electrons, ions, nuclear particles, photons, or any suitable part of the electromagnetic spectrum.

8. Apparatus for manufacturing optical storage media and optical elements from a continuous substrate comprising:

a vacuum chamber, and within said vacuum chamber, means for embossing the substrate, and means for coating the embossed substrate.

9. The apparatus as defined in claim 8 wherein said means for embossing comprises:

means for forming read only memory optical storage media, and means for forming holographic or binary diffractive optical elements.

10. A continuous process for manufacturing optical storage media and/or optical elements from a continuous substrate comprising the steps of:

intimately contacting the substrate along a first portion of an embossing tool, continuing the contacting of the substrate and the tool in a cross web linear fashion until the entire tool has impressed the substrate, and conditioning that part of the substrate immediately prior to or at the contact point.

11. The process as defined in claim 10 further comprising to steps of placing the continuous process in a vacuum chamber, and subsequently coating the embossed surface in vacuo.

12. The process as defined in claim 11 wherein said conditioning comprises the step of a shallow depth dosing of the substrate by directing energy into the surface.

13. The process as defined in claim 12 further comprising the step of placing the directed energy source and embossing drum outside the vacuum chamber.

14. The process as defined in claim 12 wherein the step of directing energy includes directing a beam selected from the group consisting of electrons, ions, nuclear particles, photons, or any suitable part of the electromagnetic spectrum.

15. The process as defined in claim 10 wherein said conditioning comprises the step of a dosing of the embossing tool by directing energy into that part of the tool immediately prior to that part of the tool contacting the substrate.

16. The process as defined in claim 10 wherein the substrate surface is comprised of thermoformable polymer material and wherein the step of conditioning comprises the step of irradiating with a beam that causes the material to thermoform.

17. The process as defined in claim 10 wherein the substrate surface is comprised of monomer or co-polymer material and wherein the step of conditioning comprises the step of irradiating with a beam that causes the material to crosslink.

18. The process as defined in claim 10 wherein the substrate surface is comprised of thermoset resin material and wherein the step of conditioning comprises the step of irradiating with a beam that causes the material to thermoset.

19. The process as defined in claim 10 wherein the step of intimately contacting comprises the steps of:

attaching the embossing tool onto a first rotating drum, such that the embossing tool returns to a specific location, directing the unwinding substrate into contact with a second rotating roll, forcing the substrate against the first rotating drum substantially at the specific location with the nip between the roll and the drum, wherein said forcing causes the substrate to be impressed with the pattern on the embossing tool.

20. The process as defined in claim 10 further comprising the step of pre-heating the embossing tool to facilitate the embossing step of intimately contacting.

21. The process of claim 10 further comprising the steps of:

waiting until the embossed area has stabilized, depositing a coating onto the embossed area, and applying a polymer for sealing chemically and mechanically the coated embossed area.

22. The embossed substrate product produced by claims 3 or 4, or 5, or 6, or 7, or 10 through 21.

* * * * *